(12) United States Patent
Kuchimachi

(10) Patent No.: US 11,116,046 B2
(45) Date of Patent: Sep. 7, 2021

(54) HEATER

(71) Applicant: KYOCERA Corporation, Kyoto (JP)

(72) Inventor: Kazuhiro Kuchimachi, Kirishima (JP)

(73) Assignee: KYOCERA CORPORATION, Kyoto (JP)

( * ) Notice: Subject to any disclaimer, the term of this patent is extended or adjusted under 35 U.S.C. 154(b) by 323 days.

(21) Appl. No.: 15/775,156

(22) PCT Filed: Sep. 29, 2016

(86) PCT No.: PCT/JP2016/078892
§ 371 (c)(1),
(2) Date: May 10, 2018

(87) PCT Pub. No.: WO2017/081951
PCT Pub. Date: May 18, 2017

(65) Prior Publication Data
US 2018/0332669 A1 Nov. 15, 2018

(30) Foreign Application Priority Data
Nov. 12, 2015 (JP) .............................. JP2015-222074

(51) Int. Cl.
*H05B 3/14* (2006.01)
*H05B 3/28* (2006.01)
(Continued)

(52) U.S. Cl.
CPC ............. *H05B 3/283* (2013.01); *H01L 21/02* (2013.01); *H05B 3/265* (2013.01); *H05B 3/74* (2013.01);
(Continued)

(58) Field of Classification Search
CPC .......... H01L 21/67103; H01L 21/6831; H05B 3/283; H05B 3/265
(Continued)

(56) References Cited

U.S. PATENT DOCUMENTS 6,054,690 A * 4/2000 Petit ...................... D06F 75/24
219/528
6,475,606 B2 * 11/2002 Niwa .................. C04B 41/009
219/538

(Continued)

FOREIGN PATENT DOCUMENTS

| JP | 51-001840 | 1/1976 |
| JP | S3-178477 A | 7/1988 |

(Continued)

OTHER PUBLICATIONS

VLSI (Chemical Mechanical Polishing processes: Erosion and Metal Dishing; retrieved at http://www.vlsi-expert.com/2015/08/ and http://www.vlsi-expert.com/2015/07/cmp.html). (Year: 2015).*

*Primary Examiner* — Robert J Utama
*Assistant Examiner* — Lawrence H Samuels
(74) *Attorney, Agent, or Firm* — Volpe Koenig

(57) ABSTRACT

A heater includes a first ceramic substrate having a heating face on one main face thereof; a second ceramic substrate disposed so that one main face thereof covers the other main face of the first ceramic substrate; a heat generating resistor disposed on the one main face of the second ceramic substrate; and an adhesive layer which bonds the first ceramic substrate and the second ceramic substrate while covering the heat generating resistor.

3 Claims, 7 Drawing Sheets

(51) Int. Cl.
    *H01L 21/67*         (2006.01)
    *H01L 21/02*         (2006.01)
    *H05B 3/26*          (2006.01)
    *H05B 3/74*          (2006.01)

(52) U.S. Cl.
    CPC .. *H05B 2203/003* (2013.01); *H05B 2203/013* (2013.01)

(58) Field of Classification Search
    USPC .................................................. 219/528, 542
    See application file for complete search history.

(56) References Cited

U.S. PATENT DOCUMENTS

| | | | | |
|---|---|---|---|---|
| 7,582,367 | B2* | 9/2009 | Aihara | C04B 35/117 |
| | | | | 118/723 R |
| 10,079,167 | B2* | 9/2018 | Kosakai | H01L 21/6833 |
| 2002/0043530 | A1* | 4/2002 | Ito | H05B 3/143 |
| | | | | 219/544 |
| 2002/0055021 | A1* | 5/2002 | Niwa | C04B 35/581 |
| | | | | 428/698 |
| 2002/0185487 | A1* | 12/2002 | Divakar | H01L 21/67103 |
| | | | | 219/444.1 |
| 2003/0148565 | A1* | 8/2003 | Yamanaka | H01L 21/2026 |
| | | | | 438/200 |
| 2004/0094871 | A1* | 5/2004 | Ito | B32B 18/00 |
| | | | | 264/434 |
| 2004/0222211 | A1* | 11/2004 | Hiramatsu | C04B 35/581 |
| | | | | 219/444.1 |
| 2005/0008835 | A1* | 1/2005 | Hiramatsu | C04B 38/0054 |
| | | | | 428/209 |
| 2005/0045618 | A1* | 3/2005 | Ito | B32B 18/00 |
| | | | | 219/444.1 |
| 2006/0021705 | A1* | 2/2006 | Imai | C23C 16/4581 |
| | | | | 156/345.52 |
| 2006/0102613 | A1* | 5/2006 | Kuibira | H05B 3/262 |
| | | | | 219/444.1 |
| 2008/0174930 | A1* | 7/2008 | Hattori | B29C 43/006 |
| | | | | 361/234 |
| 2012/0299253 | A1* | 11/2012 | Kosakai | H01L 21/67103 |
| | | | | 279/128 |
| 2013/0277357 | A1* | 10/2013 | Tatsumi | H01L 21/67103 |
| | | | | 219/443.1 |
| 2015/0129575 | A1* | 5/2015 | Tanaka | G01R 31/2874 |
| | | | | 219/460.1 |
| 2015/0364355 | A1* | 12/2015 | Kuchimachi | H01L 21/67103 |
| | | | | 156/345.52 |
| 2017/0323819 | A1* | 11/2017 | Kosakai | H01L 21/67103 |
| 2018/0053678 | A1* | 2/2018 | Kugimoto | H01L 21/67103 |
| 2019/0313482 | A1* | 10/2019 | Kamitani | H01L 21/683 |

FOREIGN PATENT DOCUMENTS

| | | |
|---|---|---|
| JP | 04-005094 U | 1/1992 |
| JP | 2002-033287 | 1/2002 |
| JP | 2004-146567 A | 5/2004 |
| JP | 2005-347559 A | 12/2005 |
| WO | 01/084888 A1 | 11/2001 |

* cited by examiner

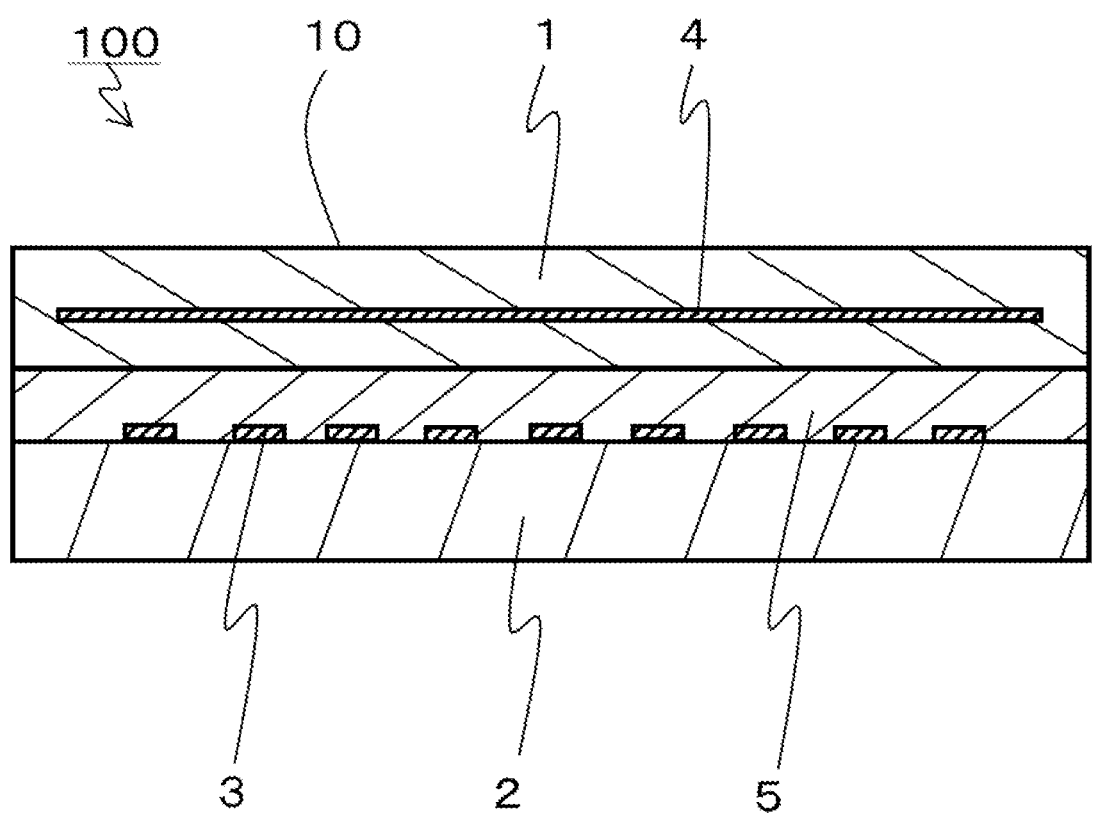

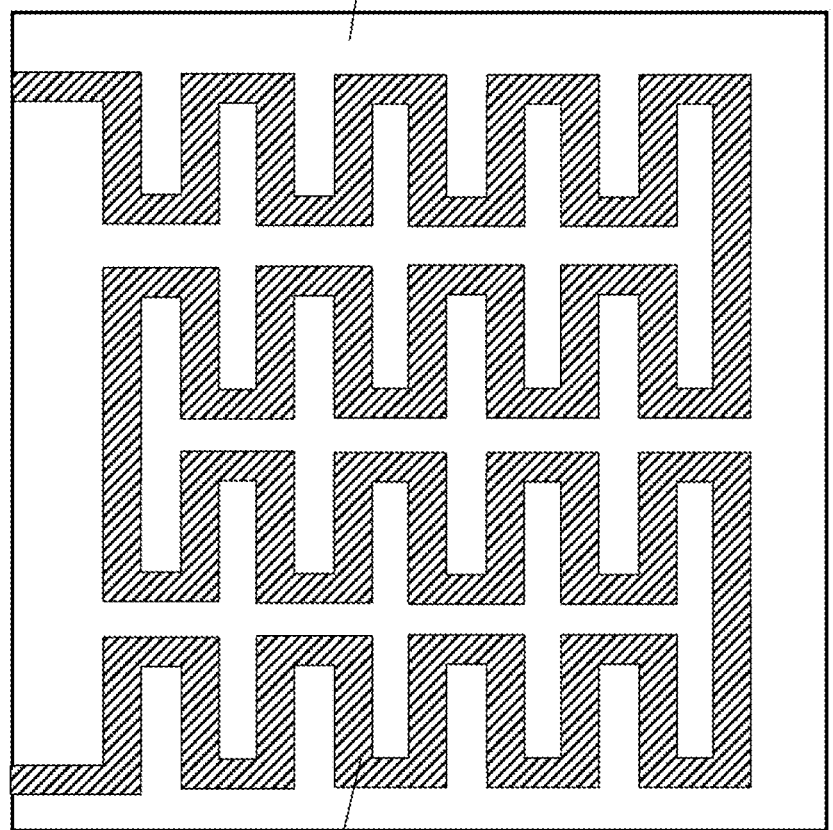

HEATER

TECHNICAL FIELD

The present invention relates to a heater.

BACKGROUND ART

As a heater, a ceramics heater for a semiconductor manufacturing apparatus described in Japanese Unexamined Patent Publication JP-A 2004-146567 (hereafter also referred to as Patent Literature 1) is known. The ceramics heater for a semiconductor manufacturing apparatus described in Patent Literature 1 has a ceramic substrate (first ceramic substrate) having a wafer mounting face (heating face) on an upper face thereof and provided with a resistance heater (heat generating resistor) on a lower face thereof and another ceramic substrate (second ceramic substrate) disposed on the lower face of the first ceramic substrate via an adhesive layer.

In recent years, a heater has been required to have a further rapid temperature rising property and a further rapid temperature lowering property while maintaining the thermal uniformity on the heating face.

In order to make the heater perform rapid temperature rising and rapid temperature lowering, the thermal capacity of the entire heater is required to be made small. In order to make the thermal capacity of the entire heater small, for example, it is conceived that the thickness of the first ceramic substrate is made small. However, in the case where the thickness of the first ceramic substrate is made small in the heater described in Patent Literature 1, the thermal uniformity on the heating face may be degraded. More specifically, a temperature difference may occur between a portion directly above an area provided with the heat generating resistor and a portion directly above an area not provided with the heat generating resistor. It is conceived that this problem occurs because the thickness of the first ceramic substrate is made too small and the heat generated in the heat generating resistor is not sufficiently diffused in a planar direction thereof.

SUMMARY OF INVENTION

A heater comprises a first ceramic substrate having a heating face on one main face thereof, a second ceramic substrate disposed so that one main face thereof covers the other main face of the first ceramic substrate, a heat generating resistor disposed on the one main face of the second ceramic substrate, and an adhesive layer which bonds the first ceramic substrate and the second ceramic substrate while covering the heat generating resistor.

BRIEF DESCRIPTION OF DRAWINGS

FIG. 1 is a sectional view showing a heater;
FIG. 2 is a schematic view showing a wiring pattern of a heat generating resistor in the heater shown in FIG. 1.

DESCRIPTION OF EMBODIMENTS

Figure 3:
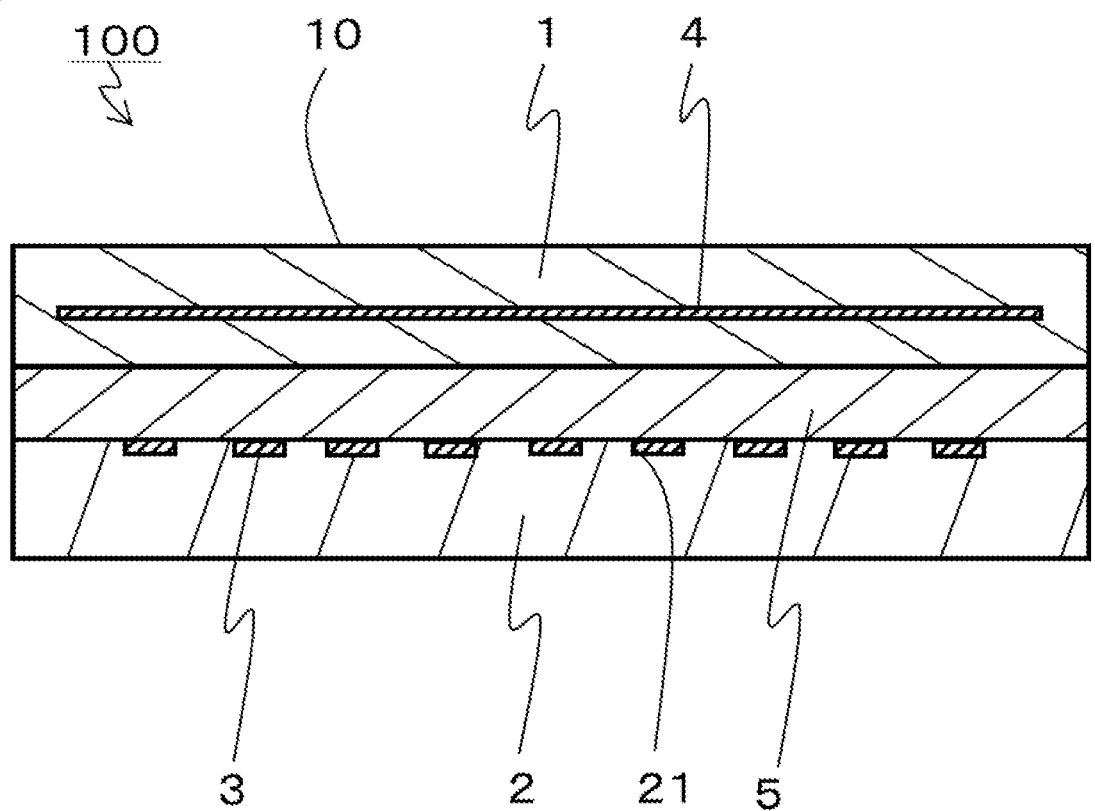
FIG. 3 is a sectional view showing another example of the heater.

A heater 100 will be described below referring to the drawings.

FIG. 1 is a sectional view showing the heater 100. As shown in FIG. 1, the heater 100 comprises a first ceramic substrate 1 having a heating face 10 on one main face thereof, a second ceramic substrate 2 disposed so that one main face thereof covers the other main face of the first ceramic substrate 1, a heat generating resistor 3 disposed on the one main face of the second ceramic substrate 2, and an adhesive layer 5 which bonds the first ceramic substrate 1 and the second ceramic substrate 2 while covering the heat generating resistor 3.

In the heater 100, the term "one main face" of the first ceramic substrate 1 indicates an upper face of the first ceramic substrate 1, and the term "the other main face" of the first ceramic substrate 1 indicates a lower face of the first ceramic substrate 1. Furthermore, the term "one main face" of the second ceramic substrate 2 indicates an upper face of the second ceramic substrate 2, and the term "the other main face" of the second ceramic substrate 2 indicates a lower face of the first ceramic substrate 2. Hence, hereafter, for convenience of explanation, the upper face and the lower face are used instead of the terms "one main face" and "the other main face" in the following descriptions. However, the term "one main face" is not limited to the upper face, and there is no problem even if the term "one main face" indicates a face other than the upper face, such as the lower face or the side face depending on the orientation of the heater 100. Furthermore, the term "the other main face" is not limited to the lower face, and in a similar way, there is no problem even if the term "the other main face" indicates a face other than the lower face, such as the upper face or the side face depending on the orientation of the heater 100.

The first ceramic substrate 1 is a plate-like member having a heating face on the upper face thereof. The first ceramic substrate 1 is a member making contact with an object to be heated. Furthermore, the first ceramic substrate 1 is a member for reducing unevenness in heat transmitted from the heat generating resistor 3 and transmitting the heat to the heating face 10. An object to be heated, such as a silicon wafer or a silicon wafer chip, is heated through the heating face 10 on the upper face of the first ceramic substrate 1. The heater 100 is a member having, for example, a rectangular shape in a plan view thereof. In this case, the first ceramic substrate 1 and the second ceramic substrate 2 are also rectangular. The first ceramic substrate 1 is formed of a ceramic material, such as alumina, aluminum nitride, silicon nitride or yttria. The dimensions of the first ceramic substrate 1 can be set to, for example, in the case of a rectangular shape, 10 to 120 mm in longitudinal length, 10 to 120 mm in transversal length, and 1 to 10 mm in thickness. Furthermore, in the case of a circular shape, the dimensions of the first ceramic substrate can be set to 50 to 450 mm in diameter and 1 to 10 mm in thickness.

As shown in FIG. 1, the heater 100 may further comprise a temperature sensor 4 inside the first ceramic substrate 1. The temperature sensor 4 is composed of, for example, a conductor pattern. Temperature measurement can be carried out by measuring change in a resistance value of the conductor pattern. In the case where the temperature sensor 4 is composed of the conductor pattern, the conductor pattern is routed, for example, almost entirely in the planar direction in a repeatedly folded-back profile. The conductor pattern is formed of a metal material, such as tungsten, molybdenum or platinum. Furthermore, as another type of the temperature sensor 4, for example, a thermocouple embedded inside the ceramic substrate 1 can be used. Embedding the temperature sensor 4 in the first ceramic substrate 1 makes it possible to carry out temperature measurement in a portion closer to the heating face 10 in comparison with the case of embedding the temperature sensor 4 in the second ceramic substrate 2. Hence, the result of the measurement by the temperature sensor 4 can be made close to the actual temperature of the heating face 10.

The second ceramic substrate 2 is a member provided with the heat generating resistor 3 on an upper face thereof. The second ceramic substrate 2 is provided so that the upper face thereof covers the lower face of the first ceramic substrate 1. The first ceramic substrate 1 and the second ceramic substrate 2 are bonded via the adhesive layer 5. The adhesive layer 5 makes contact with the lower face of the first ceramic substrate 1 and the upper face of the second ceramic substrate 2. The second ceramic substrate 2 is formed of a ceramic material, such as alumina, aluminum nitride, silicon nitride or yttria. In particular, the second ceramic substrate 2 may be formed of the same material as that of the first ceramic substrate 1. In this case, since the thermal expansion coefficient of the first ceramic substrate 1 can be made close to that of the second ceramic substrate 2, the thermal stress occurring between the first ceramic substrate 1 and the second ceramic substrate 2 can be reduced. The second ceramic substrate 2 is, for example, a rectangular member. The dimensions of the second ceramic substrate 2 can be set to, for example, in the case of a rectangular shape, 10 to 120 mm in longitudinal length, 10 to 120 mm in transversal length, and 1 to 10 mm in thickness. Furthermore, in the case of a circular shape, the dimensions can be set to 50 to 450 mm in diameter and 1 to 10 mm in thickness. The first ceramic substrate 1 and the second ceramic substrate 2 are formed so that their side faces are flush with each other.

Moreover, the second ceramic substrate 2 may have irregularity on the lower face thereof. In the case where the second ceramic substrate 2 has irregularity on the lower face thereof, the heat dissipation property on the lower face can be improved. Hence, the temperature lowering of the heater 100 can be performed quickly. As the irregularity, it is possible to use a plurality of grooves arranged in juxtaposition. The grooves are formed so as to extend along a transversal direction or a longitudinal direction of the second ceramic substrate 2, and are formed on the entire lower face of the second ceramic substrate 2.

Figure 4:
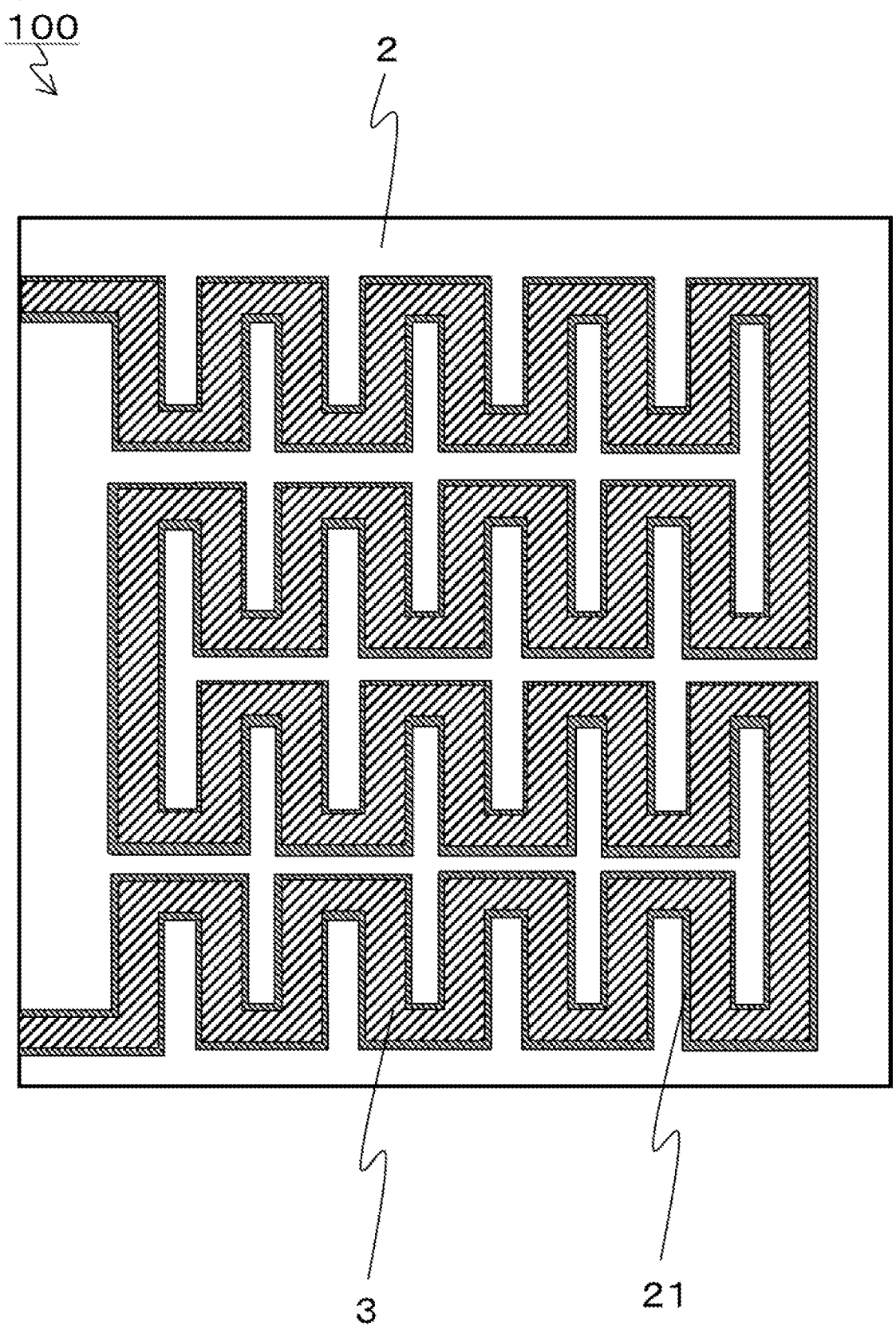
FIG. 4 is a schematic view showing the wiring pattern of the heat generating resistor in another example of the heater.

The heat generating resistor 3 is a member for heating a sample placed on the heating face 10 on the upper face of the first ceramic substrate 1. The heat generating resistor 3 is disposed on the upper face of the second ceramic substrate 2. The heat generating resistor 3 can be heated by applying voltage to the heat generating resistor 3. The heat generated in the heat generating resistor 3 is transmitted to the insides of the adhesive layer 5 and the first ceramic substrate 1 and then reaches the heating face 10 on the upper face of the first ceramic substrate 1. Hence, the sample placed on the heating face 10 can be heated. As shown in FIG. 2, the heat generating resistor 3 is formed in a line pattern having a plurality of folded-back portions and is formed on the almost entire upper face of the second ceramic substrate 2. This makes it possible to suppress the occurrence of variations in heat distribution on the heating face 10. In FIG. 2 and FIG. 4 described later, although these are not sectional views, the heat generating resistor 3 is indicated by hatching to aid the understanding of the heat generating resistor.

The heat generating resistor 3 contains a conductor component and a glass component. As the conductor component, a metal material, such as silver-palladium, platinum, aluminum or gold, is contained. A metal capable of being sintered in the atmosphere may be selected as the metal material to suppress the foaming of the glass component. Furthermore, as the glass component, oxides of materials, such as silicon, aluminum, bismuth, calcium, boron and zinc, are contained.

The method described below can be used for the temperature control of the heater 100. More specifically, temperature measurement can be carried out by providing the above-mentioned temperature sensor 4 in the inside of the first ceramic substrate 1. The voltage to be applied to the heat generating resistor 3 is adjusted on the basis of the temperature of the first ceramic substrate 1 measured as described above. Hence, the heat generation of the heat generating resistor 3 can be controlled so that the temperature of the heating face 10 becomes constant.

The adhesive layer 5 is a member for bonding the first ceramic substrate 1 and the second ceramic substrate 2. The adhesive layer 5 is disposed between the lower face of the first ceramic substrate 1 and the upper face of the second ceramic substrate 2. The adhesive layer 5 is used to bond the first ceramic substrate 1 and the second ceramic substrate 2 together with the heat generating resistor 3. The adhesive layer 5 is formed of a resin material, such as a silicone resin or an epoxy resin. The thickness of the adhesive layer 5 can be set to, for example, 0.01 to 0.3 mm. Moreover, the adhesive layer 5 may also contain filler, such as alumina or aluminum nitride.

In the heater 100, the heat generating resistor 3 is disposed on the upper face of the second ceramic substrate 2 as shown in FIG. 1, whereby the heat generated in the heat generating resistor 3 can be diffused not only in the first ceramic substrate 1 but also in the adhesive layer 5. Hence, the thermal uniformity on the heating face 10 can be improved.

Figure 5:
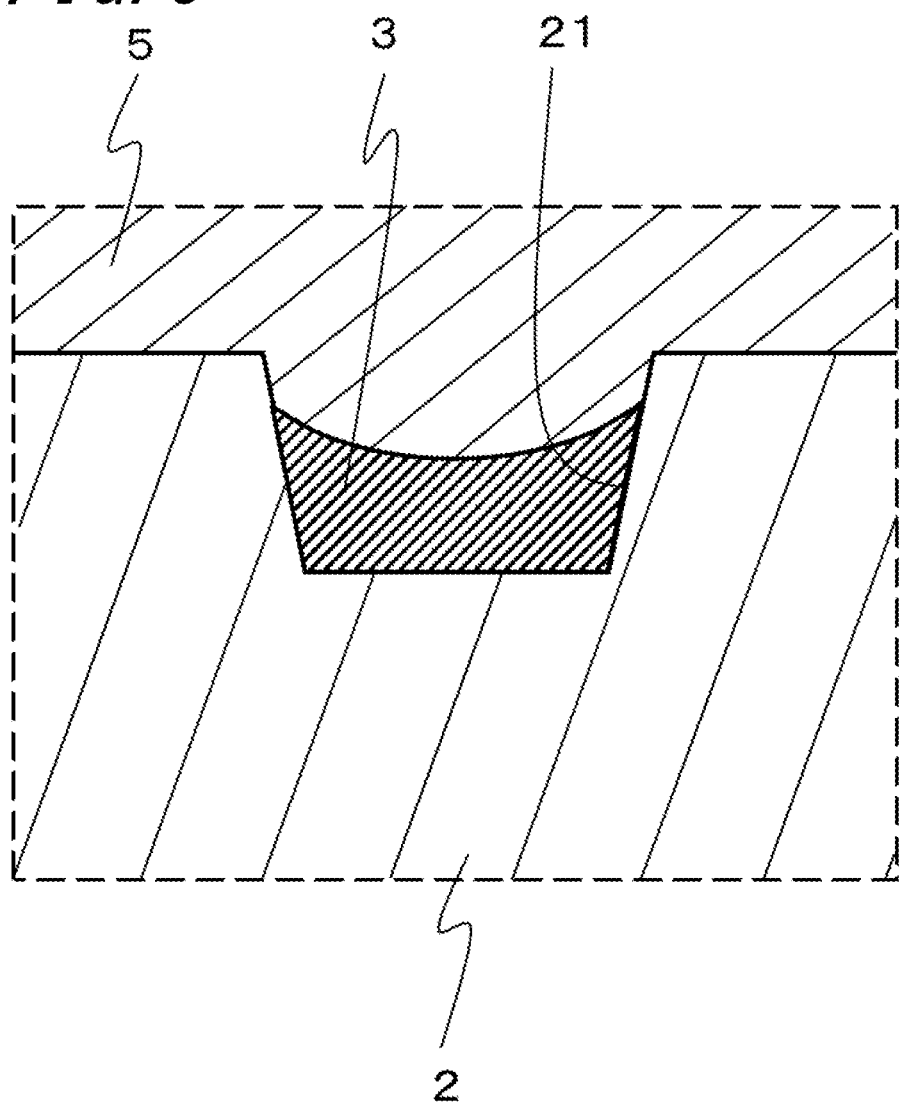
FIG. 5 is an enlarged sectional view showing the cross section of the heat generating resistor in another example of the heater.

Furthermore, as shown in FIGS. 3 to 5, the upper face of the second ceramic substrate 2 may provided with a groove section 21, and the heat generating resistor 3 may be disposed on the bottom face of the groove section 21 along the profile of the groove section 21. Since the heat generating resistor 3 is disposed in the groove section 21, when the first ceramic substrate 1 and the second ceramic substrate 2 are bonded with the adhesive layer 5, it is possible to reduce variations in the thickness of the adhesive layer 5 between an area directly above the portion provided with the heat generating resistor 3 and an area directly above the portion not provided with the heat generating resistor 3. Hence, the thermal uniformity on the heating face 10 can be improved. The dimensions of the groove section 21 can be set as follows: for example, a depth thereof can be set to 1 to 2 times the thickness of the heat generating resistor 3, and the width of the opening thereof can be set to 1 to 1.2 times the width of the bottom face thereof.

More specifically, as shown in FIG. 4, the groove section is formed so as to have the plurality of folded-back portions. In FIG. 4, although this is not a sectional view, in addition to the heat generating resistor 3, an area corresponding to the groove section 21 is also indicated by hatching to aid the understanding of the heat generating resistor and the groove section. The groove section 21 is disposed in an area corresponding to the portion in which the heat generating resistor 3 is provided. In other words, the heat generating resistor 3 is disposed on the bottom face of the groove section 21, and the heat generating resistor 3 and the groove section 21 have a similar profile in a plan view thereof.

The term "similar profile" herein indicates a profile in which a longitudinal direction (axial direction) of the pattern of the heat generating resistor 3 may merely be aligned with a longitudinal direction (axial direction) of the groove section 21, and dimensions (widths) in a width direction thereof may be different from each other. Specifically, for example, as shown in FIG. 4, the groove section 21 may be made wider than the heat generating resistor 3.

More specifically, for example, as shown in FIG. 5 showing the cross-section of the groove section 21 vertical to the axial direction thereof, the opening of the groove section 21 may be formed so as to be wider than the bottom face of the groove section 21, and the heat generating resistor 3 may be formed on the entire bottom face of the groove section 21. Furthermore, the heat generating resistor 3 is formed only on a center side in a width direction of the groove section 21, and the heat generating resistor 3 may not be formed in corners (end sides in the width direction) of the groove section 21.

In addition, as shown in FIG. 5, the thickness of the heat generating resistor 3 may be smaller than the depth of the groove section 21. In the case where the thickness of the heat generating resistor 3 is made smaller than the depth of the groove section 21, the surface of the heat generating resistor 3 can be positioned in the inside of the groove section 21 from the opening of the groove section 21. In the case where the surface of the heat generating resistor 3 is positioned below the upper face of the second ceramic substrate 2 as described above, it is possible to diffuse the heat in the planer direction in the second ceramic substrate 2 until the heat generated from the heat generating resistor 3 is transmitted to the upper face of the second ceramic substrate 2. As a result, since the thermal uniformity on the upper face of the second ceramic substrate 2 can be improved, the thermal uniformity on the heating face 10 to which the heat from the upper face is transmitted can be further improved.

Figure 6:
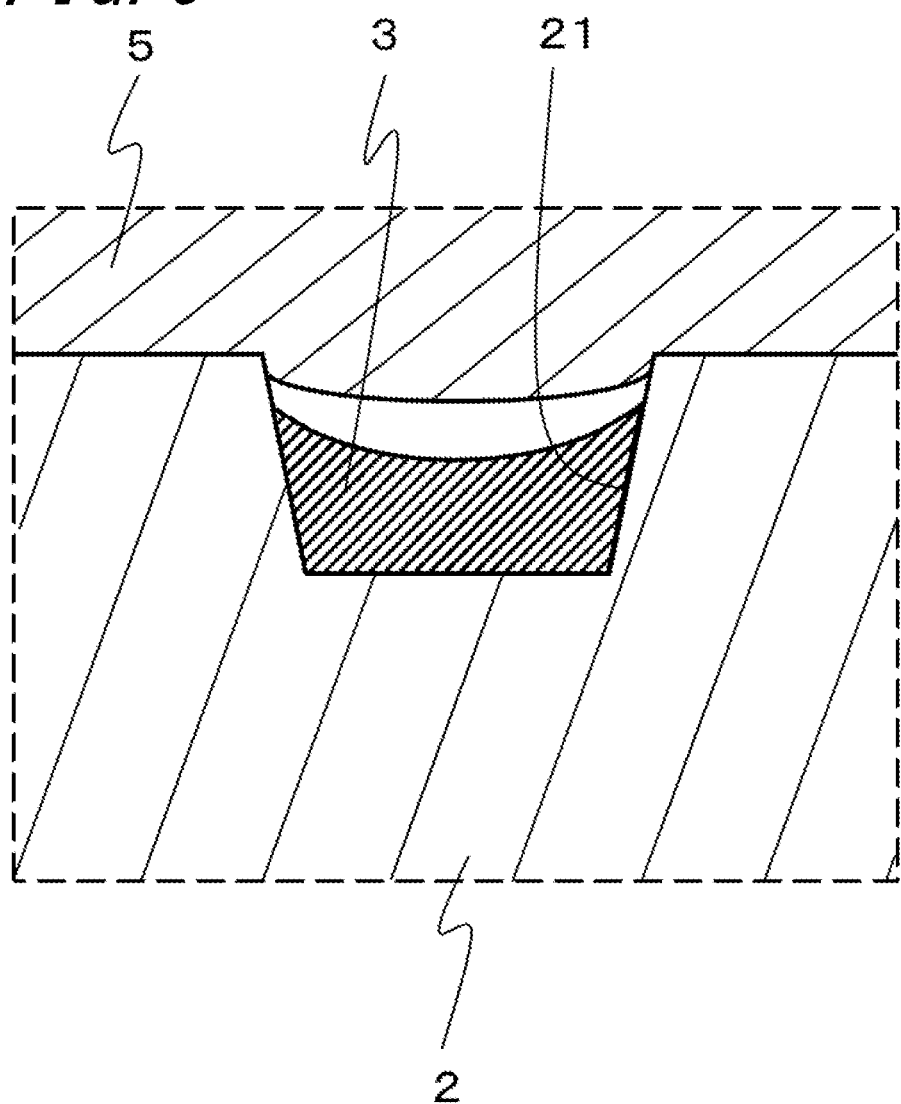
FIG. 6 is an enlarged sectional view showing the cross section of the heat generating resistor in another example of the heater.

Furthermore, as shown in FIG. 6, a clearance may be provided between the surface of the heat generating resistor 3 and the adhesive layer 5. With this structure, since the heat generated from the heat generating resistor 3 becomes easier to be transmitted to the second ceramic substrate 2, the thermal uniformity on the upper face of the second ceramic substrate 2 can be further improved. As a result, the thermal uniformity on the heating face 10 can be further improved.

Figure 7:
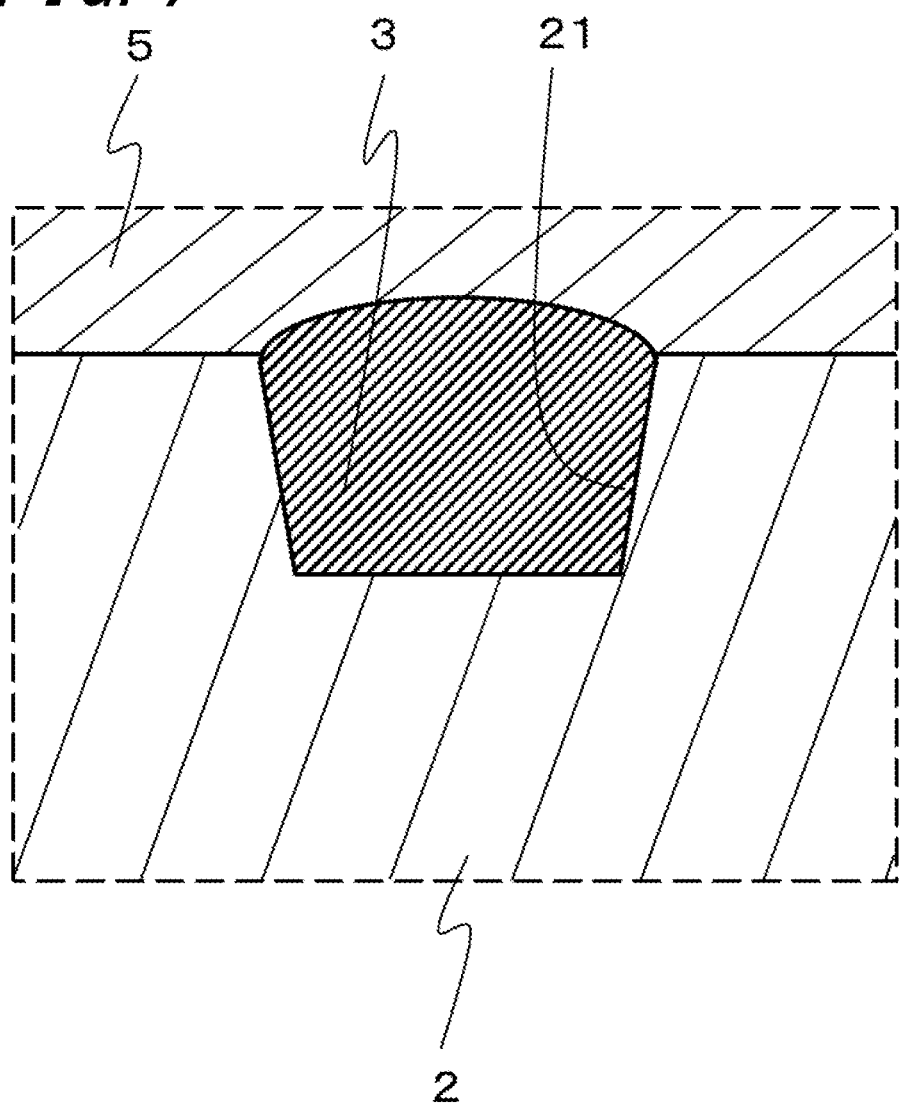
FIG. 7 is an enlarged sectional view showing the cross section of the heat generating resistor in the other heater.

Furthermore, as shown in FIG. 7, the heat generating resistor 3 may be disposed on the bottom face of the groove section 21 and a part of the heat generating resistor 3 may be positioned outside the groove section 21. With this structure, since the thickness of the heat generating resistor 3 can be increased, the risk of wire breakage, for example, can be reduced. Moreover, since the heat generating resistor 3 is disposed on the bottom face of the groove section 21, the heat generated from the heat generating resistor 3 can be diffused easily in the planer direction in the second ceramic substrate 2. As a result, since the thermal uniformity on the upper face of the second ceramic substrate 2 can be improved while the long-term reliability of the heat generating resistor 3 is improved, the thermal uniformity on the heating face 10 to which the heat from the upper face is transmitted can be further improved.

Furthermore, as shown in FIG. 5, the heat generating resistor 3 may be disposed inside the groove section 21 and the thickness of the heat generating resistor 3 may become gradually smaller toward the center side in the width direction of the groove section 21. In the case where the thickness of the heat generating resistor 3 is made gradually smaller toward the center side, the long-term reliability of the heater 100 under a heat cycle can be improved. More specifically, when the heat generating resistor 3 expands thermally under a heat cycle, the heat generating resistor 3 can easily expand thermally toward the center side by making the thickness of the center side smaller. Generally, the thermal stress under a heat cycle tends to concentrate at corner sections (portions composed of the bottom face and wall faces) of the groove section 21 of the second ceramic substrate 2. However, in the case where the thickness of the center side is made smaller and the heat generating resistor 3 is allowed to expand thermally toward the center side, the thermal stress generated at the corner sections of the groove section 21 can be reduced. Hence, the risk of crack occurrence in the second ceramic substrate 2 can be reduced. The thickness of the heat generating resistor 3 on the center side can be set to, for example, 50 to 95% in comparison with the thickness at the end sides in the width direction thereof.

Furthermore, as shown in FIG. 5, the groove section 21 may become gradually larger in width in the direction from the bottom face to the opening. With this structure, when the heat generating resistor 3 formed on the bottom face of the groove section 21 has expanded thermally, the heat generating resistor 3 easily expands thermally toward the opening. As a result, the thermal stress generated between the second ceramic substrate 2 and the heat generating resistor 3 can be reduced. The width of the groove section 21 at the opening can be set to 1.01 to 1.5 times the width of the groove section 21 at the bottom face.

The method described below is available as a method for providing the groove section 21 on the upper face of the second ceramic substrate 2 and for forming the heat generating resistor having a profile similar to that of the groove section 21 inside the groove section 21.

First, a resin mask is attached to the entire surface of the second ceramic substrate 2. The ceramic substrate 2 is fixed inside a sandblasting apparatus, and silicon carbide powder, for example, is injected as a medium from a nozzle to the surface of the second ceramic substrate 2. The resin mask is designed so as to be broken by the collision of the medium only at a portion in which the groove section 21 is desired to be formed. Hence, the groove section 21 having a predetermined depth can be provided on the surface of the second ceramic substrate 2 by continuously injecting the medium to the surface of the second ceramic substrate 2 for a predetermined time.

REFERENCE SIGNS LIST

1: First ceramic substrate
10: Heating face
2: Second ceramic substrate
21: Groove section
3: Heat generating resistor
4: Temperature sensor
5: Adhesive layer
100: Heater

The invention claimed is:
1. A heater, comprising:
a first ceramic substrate having a heating face on a first main face thereof;
a second ceramic substrate disposed so that a first main face of the second ceramic substrate covers a second main face of the first ceramic substrate;

a heat generating resistor disposed on the first main face of the second ceramic substrate; and an adhesive layer which bonds the first ceramic substrate and the second ceramic substrate while covering the heat generating resistor wherein the first main face of the second ceramic substrate includes a groove section, and the heat generating resistor is disposed on a bottom face of the groove section along a profile of the groove section, wherein a thickness of the heat generating resistor is smaller than a depth of the groove section, wherein the thickness of the heat generating resistor becomes gradually smaller toward a center side in a width direction of the groove section, and wherein the second ceramic substrate is 1 to 10 mm in thickness.

2. The heater according to claim 1, wherein a clearance is provided between the heat generating resistor and the adhesive layer.

3. The heater according to claim 1, further comprising a temperature sensor inside the first ceramic substrate.

\* \* \* \* \*